United States Patent [19]

Gaku et al.

[11] 4,396,679

[45] Aug. 2, 1983

[54] PLASTIC ARTICLES SUITABLE FOR ELECTROLESS PLATING

[75] Inventors: Morio Gaku, Showamachi; Yukiya Masuda, Toyota; Akira Katata, Tokyo; Kanzi Ishikawa, Tokyo; Nobuyuki Ikeguchi, Tokyo, all of Japan

[73] Assignee: Mitsubishi Gas Chemical Company, Inc., Tokyo, Japan

[21] Appl. No.: 274,502

[22] Filed: Jun. 16, 1981

[30] Foreign Application Priority Data

Jun. 18, 1980 [JP]  Japan ................................ 55-82297

[51] Int. Cl.³ .................... B32B 27/36; B32B 27/38
[52] U.S. Cl. ................................ 428/412; 428/413; 428/423.3; 428/423.5; 428/423.7; 428/423.9; 428/424.2; 428/424.8; 428/425.8; 428/425.5; 428/473.5; 428/474.9; 428/474.7; 428/451; 428/483; 428/494; 428/504; 428/520; 428/516; 428/517; 428/500; 428/502
[58] Field of Search ................. 428/412, 413, 423.3, 428/451, 423.5, 483, 423.7, 494, 423.9, 502, 424.2, 504, 424.8, 520, 425.8, 516, 425.5, 517, 473.5, 500, 474.9, 474.7

[56] References Cited

U.S. PATENT DOCUMENTS

| 3,448,079 | 6/1969 | Grigat et al. ........................... 260/59 |
| 3,553,244 | 1/1971 | Grigat et al. ......................... 260/453 |
| 3,562,214 | 2/1971 | Kubens et al. ......................... 260/47 |
| 3,740,348 | 6/1973 | Grigat et al. ................... 260/453 AL |
| 3,755,402 | 8/1973 | Grigat et al. ................... 260/453 AR |
| 4,016,022 | 4/1977 | Browning et al. ................... 428/413 |
| 4,080,401 | 3/1978 | Kassner .................................. 428/413 |
| 4,128,598 | 12/1978 | Makino et al. ...................... 428/413 |
| 4,248,938 | 2/1981 | Takata et al. ..................... 428/424.8 |

FOREIGN PATENT DOCUMENTS

| 2510796 | 9/1975 | Fed. Rep. of Germany ...... 428/413 |
| 52-24287 | 2/1977 | Japan .................................. 428/413 |
| 55-73549 | 6/1980 | Japan .................................. 428/413 |
| 55-127425 | 10/1980 | Japan .................................. 428/413 |
| 1060933 | 3/1967 | United Kingdom . |
| 1498233 | 1/1978 | United Kingdom . |

OTHER PUBLICATIONS

Abstract, Japanese Patents Report, JA-7011712-R, Farben Fabriken Bayer, "Cyanating Hydroxy Cpds. such as Novolac Resins".

*Primary Examiner*—P. Ives
*Attorney, Agent, or Firm*—Fleit, Jacobson & Cohn

[57] ABSTRACT

A plastic article in which a semi-cured or cured product of a curable resin composition comprising a mixture and/or a preliminary reaction product of (a) at least one cyanate compound selected from the group consisting of polyfunctional cyanate esters, prepolymers of said cyanate esters, coprepolymers of said cyanate esters and an amine and mixtures thereof, (b) at least one diene-type rubber and optionally (c) at least one compound selected from the group consisting of polyfunctional maleimides, prepolymers of the maleimides or coprepolymers of the maleimides and an amine is formed on a plastic substrate is disclosed.

13 Claims, No Drawings

PLASTIC ARTICLES SUITABLE FOR ELECTROLESS PLATING

BACKGROUND OF THE INVENTION

This invention relates to a plastic article suitable for electroless plating. Particularly, this invention relates to a plastic article which is suitable for electroless plating and in which a coating layer composed of a specific resin is formed on a plastic substrate.

In case of carrying out electroless plating on a plastic substrate, it has been attempted to form a coating layer composed of a diene type rubber-containing epoxy resin composition on a plastic substrate. However, though the peel strength of the metal layer produced by such method is satisfactory, it is unsatisfactory in respect of heat resistance.

SUMMARY OF THE INVENTION

The present inventors carried out research for obtaining a plastic article which is suitable for electroless plating and which is excellent both in peel strength of the metal layer and heat-resistance. As a result, this invention has been developed.

An object of this invention is to provide a plastic article being excellent both in peel strength of metal layer and heat-resistance.

This invention relates to a plastic article which is suitable for electroless plating and in which semi-cured or cured product of a curable resin composition comprising a mixture of and/or a preliminary reaction product of (a) a polyfunctional cyanate ester, prepolymer of the cyanate ester or coprepolymer of the cyanate ester and an amine (sometimes hereinunder referred to as component (a)) and (b) a diene type rubber (sometimes hereinunder referred to as component (b)) and optionally a polyfunctional maleimide, prepolymer of the maleimide or coprepolymer of the maleimide and an amine (sometimes hereinunder referred to as component (c)) is formed on a plastic substrate.

DETAILED EXPLANATION OF THE INVENTION

Plastic substrates include reinforced or non-reinforced plastic film, sheet, prepreg, laminate and molding. Examples of the plastics include thermosetting resins, such as phenol resin, melamine resin, epoxy resin, unsaturated polyester resin, isocyanate resin, diallyl phthalate resin, silicone resin, acrylic resin, alkyd resin, 1,2-polybutadiene resin, cyanate resin, polyimide resin, and resins modified from these resins; very excellent heat-resistant engineering resin, such as polyimide, polyamideimide, polyhydantoin resin, polyparabanic acid, polyphenylenesulfide; and heat-resistant general-purpose resin; and modified thermoplastic resins, such as crosslinked network polyethylene, nylon, polyphenylene ether, polycarbonate, and polysulfone.

Materials used for reinforcing the plastics include, for example woven or non-woven glass fabric, glass cloths, such as roving cloth, cloth, chopped mat and surfacing mat other synthetic or natural inorganic fiberous cloths; synthetic fiber cloths, such as aromatic nylon cloth, textile blend cloth composed of glass fiber and aromatic nylon, vinylon and nylon; and cotton cloth, felt, craft paper, cotton paper, paper-glass blend paper, semi-carbon fiber cloth and chopped fiber constituting these cloths, and paper.

In general, when general-purpose, heat-resistant resins or general-purpose engineering resins are used, reinforcing materials may not necessarily be used. When glass cloth, or chopped glass fiber treated with a coupling agent are used as a reinforced material in resin films, sheets, or moldings, heat-resistance of these resin films, sheets or moldings can be enhanced.

By polyfunctional cyanate ester is meant a compound having at least two cyanate groups in its molecule. The polyfunctional cyanate ester is represented by the formula

wherein R is an aromatic nucleus-containing residue which is selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

wherein $R^1$ and $R^2$ are the same or different and each represents a hydrogen atom or an alkyl group containing 1 to 4 carbon atoms,

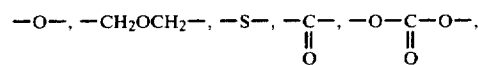

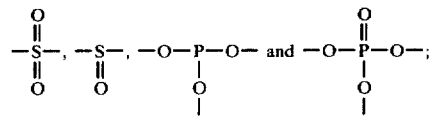

said aromatic nucleus is optionally substituted by a substituent selected from the group consisting of alkyl groups containing 1 to 4 carbon atoms, alkoxy groups, containing 1 to 4 carbon atoms, chlorine and bromine; m is an integer of 2 to 5, and the cyanate group is always directly bonded to the aromatic nucleus.

Examples of the polyfunctional cyanate ester include dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)-methane; 2,2-bis(4-cyanatophenyl)propane, 2,2-bis(3,5-dichloro-4-cyanatophenyl)propane, 2,2-bis(3,5-dibromo-4-cyanatophenyl)propane; bis(4-cyanatophenyl)ether; bis(4-cyanatophenyl)thioether; bis(4-cyanatophenyl)sulfone; tris(4-cyanatophenyl)-phosphite; tris(4-cyanatophenyl)phosphate; bis(3-chloro-4-cyanatophenyl)methane; cyanated novolak derived from novolak; cyanated bisphenol type polycarbonate oligomer derived from bisphenol type polycarbonate oligomer and mixture thereof. Other cyanate esters employed in the practice of this invention are given in Japanese Patent Publication Nos. 1928/1966, 4791/1969, 11712/1970 and 41112/1979 and Japanese Patent Publication (laid open) No. 63149/1976 which are incorporated herein for references. The above mentioned cyanate esters may be used as mixtures.

Prepolymers may be used containing a sym-triazine ring which is prepared by the trimerization of the cyanate groups of the cyanate ester, and which have an average molecular weight of at least 400 but no more than 6,000. Such prepolymers can be prepared by polymerizing the above cyanate esters in the presence of, as a catalyst, an acid such as a mineral acid or Lewis acid, a base such as sodium hydroxide, a sodium alcoholate or a tertiary amine, or a salt such as sodium carbonate or lithium chloride.

The polyfunctional cyanate ester can be used in the form of a mixture of the monomer and the prepolymer. For example, many of the commercially available cyanate esters derived from bisphenol A and cyanogen halide are in the form of mixtures of cyanate monomers and prepolymers, and such materials can also be used in the present invention.

A coprepolymer of the cyanate ester and an amine may be used as the cyanate ester component. Example of the amines include meta- or para-phenylenediamine, meta- or paraxylylenediamine, 1,4- or 1,3-cyclohexanediamine, hexahydroxylylenediamine, 4,4'-diaminobiphenyl, bis(4-aminophenyl)-methane, bis(4-aminophenyl)ether, bis(4-aminophenyl)sulfone, bis(4-amino-3-methylphenyl)methane, bis(3-chloro-4-aminophenyl)-methane, bis(4-amino-3,5-dimethylphenyl)methane, bis(4-aminophenyl)cyclohexane, 2,2-(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane and 1,1-bis(4-aminophenyl)-1-phenylethane.

A mixture of prepolymer of the cyanate ester and coprepolymer of the cyanate ester and an amine may be used.

By "diene type rubber" is meant rubbers obtained from diene type compound having unsaturated double bond and rubbers having olefinically double bond in its molecule. The diene type rubbers include, for example natural rubbers, butadiene rubber, chloroprene rubber, isoprene rubber, butadiene-acrylonitrile copolymer, (NBR rubber) butadieneacrylonitrile-isoprene terpolymer, butatiene-styrene copolymer (SB rubber), anionic block copolymer of butadiene and styrene (SBS rubber), other liquid rubbers, such as polybutadiene and butadiene-acrylonitrile copolymer having hydroxyl group or carboxyl group at its end position, and lower molecular polybutadiene, lower molecular polyisoprene, lower molecular polychloroprene and thermal decomposed natural rubbers not having any functional group at its end position. The copolymer may be prepared by copolymerizing 5–55% by weight of acrylonitrile and 95–45% by weight of butadiene and/or isoprene, and optionally an acrylate or a methacrylate. The copolymer has a Mooney viscosity of 0 (liquid at room temperature)–200 (elastic).

Reaction products of the copolymer and an isocyanate, an epoxy compound, an acrylate, a methacrylate or an unsaturated acid anhydride may also be employed as the diene rubber.

In general, the reaction product may be prepared by reacting the copolymer, preferably the copolymer having functional groups at its end position, which is liquid at room temperature and has a molecular weight of 500–10,000 and more preferably the copolymer having functional groups at its position, which is liquid at room temperature and has a molecular weight of 700–5,000 with an isocyanate, and epoxy compound, an acrylate, a methacrylate or a saturated acid anhydride in the presence or absence of a solvent.

Terpolymer of acrylonitrile, butadiene and isoprene and copolymers of acrylonitrile and one of butadiene and isoprene are preferred as the diene rubber.

The polyfunctional maleimides employed in the present invention are organic compounds having two or more maleimide groups derived from maleic anhydride and a polyamine and are represented by the following general formula

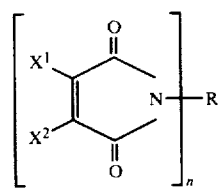

wherein R represents divalent to pentavalent aromatic or alicyclic organic group, each of $X^1$ and $X^2$ represents a hydrogen atom, halogen atom or alkyl group, and n represents integer of 2–5.

The maleimides represented by the above formula can be produced by a method known per se which involves reacting maleic anhydride with polyamine to form a maleamide acid, and then dehydro-cyclizing the maleamide acid. Examples of polyfunctional maleimide include 1,3- or 1,4-dimaleimido benzene, 1,3- or 1,4-bis(maleimidomethylene)benzene, 1,3- or 1,4-dimaleimido cyclohexane, 1,3- or 1,4-bis(maleimidomethylene)cyclohexane 4,4'-dimaleimidobiphenyl, bis(4-maleimidophenyl)methane, bis(4-maleimidophenyl)ether, bis(4-maleimidophenyl)sulfone, bis(4-maleimido-3-methylphenyl)-methane, bis(4-maleimido-3-chlorophenyl)methane, bis(4-maleimido-3,5-dimethylphenyl)methane, 2,2-bis(4-maleimido-3-methylphenyl)propane, 2,2-bis(4-maleimido-3,5-dibromophenyl)-propane, bis(4-maleimidophenyl)phenylmethane, 3,4-dimaleimidophenyl-4'-maleimidophenylmethane,1,1-bis(4-maleimidophenyl)-1-phenylmethane, maleimides derived from melamine and maleimides derived from addition product of formalin and an aniline in which benzene rings of two or more aniline bond through methylene group.

Aromatic amines are preferable as the starting polyamines. The reason is that the resulting object resin has excellent properties, such as heat-resistance, etc. When the resulting object resins have desirable flexibility and pliability, alicyclic amine alone or combination of the alicyclic amines and other amines may be used. Though secondary amines can be used as the starting amine, the primary amines are preferable.

Amines employed in reaction with cyanate esters for preparing coprepolymers of the cyanate ester and the amine may be profitably used as an amine component for preparing maleimides. In addition to the above-mentioned amines, melamine having s-triazine ring and polyamines obtained by reaction aniline with formaldehyde, in which two or more benzene rings are bonded through methylene bond, may also be used.

The functional maleimides as mentioned above may be used alone or as a mixture. Also the prepolymer of the maleimide obtained by heating the maleimide in the presence or absence of a catalyst may be used. In addition, coprepolymers of the maleimide and the amine employed for synthesizing the polyfunctional maleimide may be used.

The ratio of component (a) and component (c) is not critical. In general, the ratio by weight component (a) and component (c) may be in the range of from 99:1 to 1:99, and preferably 95:5 to 20:80.

The ratio of component (a) and component (b) is not critical. When preparing heat resistant resin having good adhering property, 1–50% by weight of component (b) and preferably 5–40% by weight of component (b) may be used on the basis of total weight of components (a) and (b) or on the basis of total weight of components (a), (b) and (c) (when component (c) is used). In order to improve heat resistance of cured resin derived from component (b), it is preferable to use 5–50% by weight of component (a) or components (a) and (c) on the basis of total weight of components (a) and (b) or components (a), (b) and (c).

The curable composition of this invention comprises a mixture and/or a preliminary reaction product of component (a) and component (b), and optionally component (c) and optionally other functional group-containing compound (sometimes hereinunder referred to as component (d)). Component (d) includes, for example, esters of acrylic or methacrylic acid and an alcohol, such as methanol, ethanol, propanol, butanol, ethylene glycol, propylene glycol, polyethylene glycol, or polypropylene glycol, allyl esters, such as diallyl phthalate and triallyl phthalate; olefinically unsaturated double bond-containing compounds, such as styrene, vinyl toluene, divinyl benzene, allyl benzene, diallyl benzene, diallyl bisphenol, dicyclopentadiene or vinyl cyclohexane; and epoxy resin. The resin component may be a mixture of components (a) and (b) and optionally (c) and/or (d); a preliminary reaction product of components (a) and (b), components (a), (b) and (c) or components (a), (b), (c) and (d); a mixture of preliminary reaction product of two or three of components (a), (b), (c) and (d) and the remainder thereof.

The curable composition of this invention may be reticulated by heating it alone to form a cured resin having heat resistance. In general, a catalyst may be used in order to promote crosslinking reaction of the components in the composition.

Examples of the catalysts include imidazoles, such as 2-methylimidazole, 2-undecylimidazole, 2-heptadecylimidazole, 2-phenylimidazole, 2-ethyl-4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition product of an imidazole and trimellitic acid; tertiary amines, such as N,N-dimethyl benzylamine, N,N-dimethylaniline, N,N-dimethyltoluidine, N,N-dimethyl-p-anisidine, p-halogeno-N,N-dimethylaniline, 2-N-ethylanilino ethanol, tri-n-butylamine, pyridine, quinoline, N-methylmorpholine, triethanolamine, triethylenediamine, N,N,N',N'-tetramethylbutanediamine, N-methylpiperidine; phenols, such as phenol, cresol, xylenol, resorcine, and phloroglucin; organic metal salts, such as lead naphthenate, lead stearate, zinc naphthenate, zinc caprylate, tin oleate, dibutyl tin maleate, manganese naphthenate, cobalt naphthenate, and acetyl acetone iron; and inorganic metal salts, such as stannic chloride, zinc chloride and aluminum chloride; peroxides, such as benzoyl peroxide, lauroyl peroxide, octanoly peroxide, acetyl peroxide, para-chlorobenzoyl peroxide and di-t-butyl diperphthalate; acid anhydrides, such as maleic anhydride, phthalic anhydride, lauric anhydride, pyromellitic anhydride, trimellitic anhydride, hexahydrophthalic anhydride, hexahydorpyromellitic anhydride and hexahydrotrimellitic anhydride; azo compounds, such as azoisobutylonitrile, 2,2'-azobispropane, m,m'-azoxystyrene, hydrozones, and mixtures thereof.

In addition to the above-mentioned catalyst, a curing agent for epoxy resin and a curing catalyst for epoxy resin may be used as a catalyst of this invention.

The amount of the catalyst employed may be less than 5% by weight of total composition.

A variety of additives may be added to the curable composition to impart specific properties provided that they do not impair the essential properties of the resulting resin. Examples of the additives include natural or synthetic resins, fibrous reinforcement, fillers, pigments, dyestuffs, thickening agents, lubricants, flame-retardants and the like.

When a metal or a metal oxide, such as Pd, Au, Ag, Cu or CuO is incorporated into the curable resin composition, electroless plating can be carried out on the resulting plastic article without further treatment of the article.

The above curable resin composition may be coated on or impregnated in a plastic substrate, and heated to prepare a plastic article. Alternatively, the resin composition may be adhered to the surface of the non-cured plastic substrate during molding of the plastic substrate, to prepare a plastic article.

The coating of the curable resin composition on a plastic substrate or impregnating of the composition in a plastic substrate may be carried out by a wet method, when the composition is free of any solvent and liquid, or varnish. When the composition is powderous, it may be coated on or impregnated in a plastic substrate by a dry method.

Adhering the curable resin composition to a plastic substrate during molding of the substrate is particularly suitable, when the substrate is in a flat form, such as film, sheet or flat laminate. The method comprises forming B-staged or semi-cured product of the curable resin composition on a release film, overlapping the resulting laminate with a resin film as a plastic substrate or sheet, or prepreg to be molded to plastic substrate and heating them under pressure to cure or semi-cure the composition and simultaneously transfer the cured or semi-cured layer from the release film to the plastic substrate.

In general, the thickness of the cured or semi-cured product may be between 2–250$\mu$.

The heating conditions of the resin composition depend on the kind of the resin compositions, the components contained in the composition and the catalyst employed. In general, the composition may be heated at 80°–350° C. and preferably 110°–250° C. for 0.1–10 hours.

Electroless plating on the plastic article so prepared can be carried out by well known methods.

In general, electroless plating comprises the following:

(a) treating a plastic article with a strong aqueous acid solution containing an oxidizing agent, (b) optionally activating the surface of the plastic article, and (c) effecting electro plating on the article.

The strong aqueous acid solutions containing an oxidizing agent include, for example a mineral acid, such as sulfuric acid, hydrochloric acid, phosphoric acid, nitric acid or hydrofluoric acid in a concentration of more than 20% by volume and preferably 25-60% by volume containing an oxidizing agent, such as a chromate, a permanganate, a perchlorate, a persulfate, or hydrogen peroxide in an amount of more than 1 g/liter and preferably more than 5 g/liter. In order to avoid unevenness of treatment and forming of mist and to stabilize the oxidizing agent, surfactants and/or alcohols may be added to the strong aqueous acid solution.

The activating treatment means adhering on the plastic article a material which promotes deposit of electroless plating metal. When the resin composition contains Au, Ag, Cu, Pd or CuO in a form of powder, the activating treatment may not necessarily be carried out. The activating treatment comprises treating the plastic article with an aqueous stannous chloride solution, followed by treating the article with an aqueous palladium chloride solution.

Electroless nickel plating and electroless copper plating, etc. can be carried out on the plastic article so treated. As occasion demands, electrolytic plating can be carried on the electroless plated plastic article.

Such electroless plated plastic article or electrolytic plated plastic article can be used for a variety of toys, or parts for automobile, such as bumper or knobs or print circuits.

The present invention is further illustrated by the following non-limiting Examples and Controls. Percent and parts are by weight, unless otherwise specified.

EXAMPLE 1

1,4-Dicyanatobenzene (1000 grams) was preliminarily polymerized at 150° C. for 300 min. The resulting prepolymer was dissolved in methyl ethyl ketone. To the solution were added zinc caprylate (0.3 g) and triethylene diamine (0.2 g). A glass cloth web was impregnated with the varnish prepared above, and dried to obtain semi-cured resin-containing glass cloth web.

2,2-Bis(4-cyanatophenyl)propane (900 g) and bis(4-maleimidophenyl)methane (100 g) were preliminarily reacted at 150° C. for 150 min. Glycidyl methacrylate (400 g), butadiene-acrylonitrile copolymer (acrylic content of 8.5%, viscosity of 117 poise, number of carboxyl group on average in its molecule of 1.16, number of hydroxyl group on average in its molecule of 1.41) (300 g), and zinc caprylate (0.3 g), triethylene diamine (0.2 g) and benzoyl peroxide (0.2 g) as a catalyst were added to the prepolymer to obtain a uniform resin solution.

The resulting resin solution was coated on the glass cloth web prepared above and heated to cure the resin, thereby obtaining a good flexible, continuous sheet.

The continuous sheet was immersed in a preplating solution containing $CrO_3$ (50 g/l) and $H_2SO_4$ (40 vol%) (residence time of 10 min.), washed with water and dried.

The resulting sheet was activated by a conventional method, and then electroless nickel plating was conducted on the sheet at 40° C. for 5 minutes by using NBW nickel solution produced by Okuno Seiyaku Kogyo K.K. Then the sheet was washed with water and dried. The electrolytic copper plating was conducted on the electroless plated sheet, and was washed with water and dried at 80° C. The properties of the plating layer are shown in Table 1.

CONTROL TEST 1

The glass web was prepared in the same way as in Example 1. Tung oil-modified phenol resin (900 g), butadieneacrylonitrile copolymer (300 g) employed in Example 1 and alumina (100 g) were dissolved in a mixture of methyl ethyl ketone, toluene and diacetone alcohol. The procedure of Example 1 was repeated except that the solution prepared above was employed in place of the resin solution of Example 1. The properties of the resulting plating layer are shown in Table 1.

EXAMPLE 2

2,2-Bis(4-cyanatophenyl)propane (800 g) and bis(4-maleimidophenyl)ether (200 g) were preliminarily reacted at 150° C. for 150 minutes. The preliminary reaction product was dissolved in a mixture of methyl ethyl ketone and N,N-dimethylformamide.

Epoxy resin (Epikote 1001, produced by Shell Chemical Co., Ltd.) (200 g) and butadiene-acrylonitrile-methacrylic acid type rubber (Nipol 1072 produced by Nippon Zeon Co., Ltd.) (700 g) were preliminarily reacted in a methyl ethyl ketone solution at 79° C. for 4 hours.

The two preliminary reaction products were blended. To the resulting mixture zinc caprylate (0.3 g) and stearic acid (0.1 g) and benzoyl peroxide (0.2 g) as catalyst were added, and mixed uniformly to obtain a resin solution.

The resulting resin solution was coated on paper-based epoxy resin prepreg which had been dried under milder conditions than usual conditions.

Six sheets of prepregs dried under usual conditions were sandwiched between two sheets of resin coated prepreg prepared above and pressed at 120 Kg/cm$^2$ and 165° C. for 2 hours.

The resulting laminate was immersed in a 35 vol% aqueous sulfuric acid solution containing 150 g/l of $CrO_3$ at 50° C. for 30 minutes, washed with water, dried, and metallized in the same way as in Example 1. The properties of the resulting metal layer are shown in Table 1.

CONTROL TEST 2

Epoxy resin (Epikote 1001 produced by Shell Chemical Co., Ltd.) (100 g), butadiene-acrylonitrile-methacrylic acid rubber (Nipol 1072 produced by Nippon Zeon Co., Ltd.) (35 g), talc (30 g), dicyandiamide (4 g) and benzylmethylamine (0.2 g) were preliminarily reacted in a mixture of methyl ethyl ketone and N,N-dimethylformamide at 79° C. for 4 hours to obtain the resin solution. The procedure of Example 2 was repeated except that the resin solution was coated on paperbased epoxy resin prepreg of the Example 2 in place of the two resin solutions. The properties of the resulting metal layer are shown in Table 1.

CONTROL TEST 3

The resin solution of Example 2 was uniformly coated on glass epoxy resin laminate (GEP 130 produced by Mitsubishi Gas Chemical Co., Inc.) by using rolls, and heated at 160° C. for 120 minutes for drying. The resulting laminate was immersed in a 40 vol% aqueous solution of $H_2SO_4$ containing 150 g/l of $H_2O_2$ at 40° C. for 15 minutes, and washed with water for 15 minutes.

The laminate was metallized in the same way as in Example 1. The properties of the metal layer are shown in Table 1.

g/l of $KM_nO_4$ was used in place of the preliminary plating solution of Example 4.

The results are shown in Table 1.

TABLE 1

| | Example 1 | Control test 1 | Example 2 | Control test 2 | Control test 3 | Example 3 | Example 4 | Example 5 | Example 6 |
|---|---|---|---|---|---|---|---|---|---|
| thickness of metal layer (mm) | 0.029 ~ 0.038 | same as the left | same as the left | same as the left | same as the left | same as the left | same as the left | same as the left | same as the left |
| peel (25° C.) | 2.6 | 2.0 | 2.2 | 1.7 | 1.9 | 2.3 | 2.1 | 1.8 | 1.9 |
| strength (100° C.) | 2.3 | 1.5 | 1.9 | 1.3 | 1.4 | 1.9 | 1.7 | 1.6 | 1.7 |
| of metal (180° C.) | 2.1 | 0.2 | 1.6 | 0.3 | 0.2 | 1.7 | 1.5 | 1.3 | 1.3 |
| layer (250° C.) (Kg/cm) | 1.6 | 0.2 | 1.3 | 0.2 | 0.1 | 1.4 | 1.3 | 1.1 | 1.1 |
| hot solder*[1] resistance (300° C. 2 min. float) | no problem | metal plating layer was peeled | no problem | metal plating layer was peeled | same as the left | no problem | same as the left | same as the left | same as the left |
| moisture resistance (in steam at 120° C. 2 atm 24 hrs.)*[2] | changed slightly | resin whitened | no change | resin whitened | same as the left | no change | no change | no change | no change |
| surface [A] resistance*[3] $(\Omega)\left[D - \frac{4}{100}\right]$ | $5 \times 10^{12}$ $6 \times 11^{11}$ | $5 \times 10^{12}$ $2 \times 10^{9}$ | $6 \times 10^{12}$ $4 \times 10^{11}$ | $4 \times 10^{12}$ $6 \times 10^{10}$ | $5 \times 10^{12}$ $5 \times 10^{10}$ | $4 \times 10^{12}$ $2 \times 10^{11}$ | $5 \times 10^{12}$ $4 \times 10^{11}$ | $5 \times 10^{12}$ $3 \times 10^{11}$ | $7 \times 10^{12}$ $6 \times 10^{11}$ |

Note:
*[1]: 25 mm × 25 mm sample was used.
*[2]: Sample, metal layer of which, was deleted by etching was used.
*[3]: Comb type test pattern (pattern width 1 mm) was used for measurement.

EXAMPLE 3

2,2-Bis(4-cyanatophenyl)propane (900 g) and bis(4-maleimidophenyl)methane (100 g) were preliminarily reacted at 150° C. for 150 minutes. To the resulting preliminary reaction product glycidylmethacrylate (400 g), butadieneacrylonitrile copolymer (Nipol 1312 produced by Nippon Zeon Co., Ltd.) (300 g) and zinc caprylate (0.3 g), triethylenediamine (0.2 g), and benzoyl peroxide (0.2 g) were added and mixed uniformly.

Part of the resin solution was heated to 50° C. and coated on molded plate (2.5 mm thick) composed of polyphenylenesulfide resin by using rolls and then heated at 160° C. for 120 minutes. The resulting plate was metallized in the same way as in Example 1. The properties of the metal layer are shown in Table 1.

EXAMPLE 4

The procedure of Example 3 was repeated except that glass cloth based epoxy resin laminate is used in place of molded plate composed of polyphenylene sulfide resin and a 35 vol% aqueous solution of $H_2SO_4$ containing 50 g/l of $(NH_4)_2S_2O_8$ was used in place of the preliminary plating solution of Example 3.

The results are shown in Table 1.

EXAMPLE 5

The procedure of Example 4 was repeated except that butadiene rubber (Hycar CTB produced by Ube Industries, Ltd.) was used in place of butadiene acrylonitrile rubber employed for preparing the resin solution and a 40 vol% aqueous solution of $H_2SO_4$ containing 10 g/l of $CrO_3$ was used in place of the preliminary plating solution of Example 4.

The results are shown in Table 1.

EXAMPLE 6

The procedure of Example 4 was repeated except that a 60 vol% aqueous solution of $H_2SO_4$ containing 15

What is claimed is:

1. A plastic article for electroless plating in which a semi-cured or cured product of a curable resin composition comprises:
   (a) at least one cyanate ester compound selected from the group consisting of
      (1) a polyfunctional cyanate ester monomer,
      (2) a homoprepolymer of one or more cyanate esters of (1), and
      (3) a coprepolymer of (1) and an amine, and
   (b) at least one diene-type rubber, said composition including a mixture of components (a) and (b), a preliminary reaction product of components (a) and (b), or the combination of said mixture and said preliminary reaction product, is formed on a plastic substrate.

2. The plastic article as defined in claim 1 wherein the cyanate ester is selected from the group consisting of 1,3-, 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)-methane; 2-2-bis(4-cyanatophenyl)propane, 2,2-bis(3,5-dichloro-4-cyanatophenyl)propane, 2,2-bis(3,5-dibromo-4-cyanatophenyl)-propane; bis(4-cyanatophenyl)ether; bis(4-cyanatophenyl)-thioether; bis(4-cyanatophenyl)sulfone; tris(4-cyanatophenyl)-phosphite; tris(4-cyanatophenyl)phosphate; bis(3-chloro-4-cyanatophenyl)methane; cyanated novolak; derived from novolak cyanated bisphenol type polycarbonate oligomer derived from bisphenol type polycarbonate oligomer and mixture thereof.

3. The plastic article as defined in claim 1 wherein component (b) is selected from the group consisting of natural rubbers, butadiene rubber, chloroprene rubber, isoprene rubber, butadiene-acrylonitrile copolymer, butadieneacrylonitrile-isoprene terpolymer, butadiene-styrene copolymer, anionic block copolymer of butadiene and styrene, polybutadiene, butadiene-acrylonitrile copolymer having hydroxyl group or carboxyl group at its end position, and lower molecular polybutadiene, lower molecular polyisoprene, lower molecular polychloroprene and thermal decomposed natural rubbers not having any functional group at its end position.

4. The plastic article as defined in claim 1 wherein the ratio by weight of component (a) to component (b) is between 99:1 to 1:99.

5. The plastic article as defined in claim 1 wherein the ratio by weight of component (a) to component (b) is between 95:5 to 20:80.

6. The plastic article as defined in claim 1 wherein the plastic substrate is reinforced or non-reinforced.

7. The plastic article as defined in claim 1 wherein the material of the plastic substrate is selected from the group consisting of phenol resin, melamine resin, epoxy resin, unsaturated polyester resin, isocyanate resin, diallyl phthalate resin, silicone resin, acrylic resin, alkyd resin, 1,2-polybutadiene resin, cyanate resin, polyimide resin, resins modified from these resins, polyimide, polyamideimide, polyhydantoin resin, polyparabanic acid, polyphenylenesulfide, crosslinked network polyethylene, nylon, polyphenylene ether, polycarbonate, and polysulfone.

8. A plastic article for electroless plating in which a semi-cured or cured product of a curable resin composition comprises:
(a) at least one cyanate ester compound selected from the group consisting of
(1) a polyfunctional cyanate ester monomer,
(2) a homoprepolymer of one or more cyanate esters of (1), and
(3) a coprepolymer of (1) and an amine,
(b) at least one diene-type rubber, and
(c) at least one maleimide compound selected from the group consisting of:
(1) a polyfunctional maleimide,
(2) a homoprepolymer of one or more maleimides of (1), and
(3) a coprepolymer of (1) and an amine,
said composition including a mixture of components (a), (b) and (c), a preliminary reaction product of components (a), (b) and (c), the combination of said mixture and said preliminary reaction product, the combination of (a) and the preliminary reaction product of (b) and (c), the combination of (b) and the preliminary reaction product of (a) and (c), or the combination of (c) and the preliminary reaction product of (a) and (b), is formed on a plastic substrate.

9. The plastic article as defined in claim 8 wherein the cyanate ester is selected from the group consisting of 1,3-, 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane, 2,2-bis(3,5-dichloro-4-cyanatophenyl)propane, 2,2-bis(3,5-dibromo-4-cyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; cyanated novolak derived from novolak; cyanated bisphenol type polycarbonate oligomer derived from bisphenol type polycarbonate oligomer and mixture thereof.

10. The plastic article as defined in claim 8 wherein component (b) is selected from the group consisting of natural rubbers, butadiene rubber, chloroprene rubber, isoprene rubber, butadiene-acrylonitrile copolymer, butadieneacrylonitrile-isoprene terpolymer, butadiene-styrene copolymer, anionic block copolymer of butadiene and styrene, polybutadiene butadiene-acrylonitrile copolymer having hydroxyl group or carboxyl group at its end position, and lower molecular polybutadiene, lower molecular polyisoprene, lower molecular polychloroprene and thermal decomposed natural rubbers not having any functional group at its end position.

11. The plastic article as defined in claim 8 wherein the plastic substrate is reinforced or non-reinforced.

12. The plastic article as defined in claim 8 wherein the material of the plastic substrate is selected from the group consisting of phenol resin, melamine resin, epoxy resin, unsaturated polyester resin, isocyanate resin, diallyl phthalate resin, silicone resin, acrylic resin, alkyd resin, 1,2-polybutadiene resin, cyanate resin, polyimide resin, resins modified from these resins, polyimide, polyamideimide, polyhydantoin resin, polyparabanic acid polyphenylenesulfide-crosslinked network polyethylene, nylon, polyphenylene ether, polycarbonate, and polysulfone.

13. The plastic article as defined in claim 8 wherein the polyfunctional maleimide is selected from the group consisting of 1,3- or 1,4-dimaleimido benzene, 1,3- or 1,4-bis(maleimidomethylene)benzene, 1,3- or 1,4-dimaleimido cyclohexane, 1,3- or 1,4-bis(maleimidomethylene)cyclohexane, 4,4'-dimaleimido biphenyl, bis(4-maleimidophenyl)methane, bis(4-maleimidophenyl)ether, bis(4-maleimidophenyl)sulfone, bis(4-maleimido-3-methylphenyl)methane, bis(4-maleimido-3-chlorophenyl)methane, bis(4-maleimido-3,5-dimethylphenyl)methane, 2,2-bis(4-maleimido-3-methylphenyl)propane, 2,2-bis(4-maleimido-3,5-dibromophenyl)propane, bis(4-maleimidophenyl)-phenylmethane, 3,4-dimaleimidophenyl-4'-maleimidophenylmethane, 1,1-bis(4-maleimidophenyl)-1-phenyl-methane, and maleimido derived from melamine, and maleimide derived from addition product of formalin and an aniline in which benzene rings of two or more aniline bond through methylene group.

* * * * *